United States Patent
Parry et al.

(10) Patent No.: US 11,454,941 B2
(45) Date of Patent: Sep. 27, 2022

(54) PEAK POWER MANAGEMENT OF DICE IN A POWER NETWORK

(71) Applicant: Micron Technology, Inc., Boise, ID (US)

(72) Inventors: Jonathan S. Parry, Boise, ID (US); David A. Palmer, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 563 days.

(21) Appl. No.: 16/510,662

(22) Filed: Jul. 12, 2019

(65) Prior Publication Data

US 2021/0011442 A1     Jan. 14, 2021

(51) Int. Cl.
   *G05B 19/042*     (2006.01)
   *H01L 21/66*      (2006.01)
   *G11C 5/14*       (2006.01)

(52) U.S. Cl.
   CPC .............. *G05B 19/042* (2013.01); *G11C 5/14* (2013.01); *H01L 22/00* (2013.01); *G05B 2219/2639* (2013.01)

(58) Field of Classification Search
   CPC .................................................. G05B 19/042
   USPC ......................................................... 716/133
   See application file for complete search history.

(56) References Cited

U.S. PATENT DOCUMENTS

| | | |
|---|---|---|
| 6,507,530 B1 | 1/2003 | Williams et al. |
| 9,417,685 B2 | 8/2016 | Ha et al. |
| 11,079,829 B2 * | 8/2021 | Parry ................... G06F 3/0688 |
| 2002/0040416 A1 | 4/2002 | Tsern et al. |
| 2003/0182588 A1 | 9/2003 | Dodd et al. |
| 2003/0206476 A1 | 11/2003 | Joo |
| 2004/0006659 A1 | 1/2004 | Lee |
| 2004/0260957 A1 | 12/2004 | Jeddeloh et al. |
| 2006/0152966 A1 | 7/2006 | Park |

(Continued)

FOREIGN PATENT DOCUMENTS

| | | |
|---|---|---|
| CN | 101986241 A | 3/2011 |
| CN | 105074832 A | 11/2015 |
| KR | 10-2015-0121537 A | 10/2015 |

OTHER PUBLICATIONS

Non-Final Office Action, U.S. Appl. No. 16/510,696, dated Nov. 25, 2020, 25 pages.

(Continued)

*Primary Examiner* — Suchin Parihar
(74) *Attorney, Agent, or Firm* — Nicholson De Vos Webster & Elliott LLP

(57) ABSTRACT

Exemplary methods, apparatuses, and systems include a first die in a power network receiving, from each die of a plurality of dice in the power network, a first signal indicating that the respective die of the plurality of dice is in a high current state or a second signal indicating that the respective die of the plurality of dice is an active current state. The received signals include at least one second signal. The first die determines, based upon the received signals, a number of dice of the plurality of dice that are currently active and selects an activity threshold based upon that number. The first die further determines an activity level for the power network and transmits, to the plurality of dice, the first signal indicating that the first die is in the high current state in response to determining that the activity level is less than the activity threshold.

20 Claims, 4 Drawing Sheets

(56) References Cited

U.S. PATENT DOCUMENTS

| | | |
|---|---|---|
| 2007/0011421 A1 | 1/2007 | Keller et al. |
| 2007/0288783 A1 | 12/2007 | Ogasawara et al. |
| 2008/0098277 A1 | 4/2008 | Hazelzet |
| 2008/0263373 A1 | 10/2008 | Meier et al. |
| 2009/0070612 A1 | 3/2009 | Adelman et al. |
| 2009/0089602 A1 | 4/2009 | Bose et al. |
| 2009/0219767 A1 | 9/2009 | Lines et al. |
| 2009/0300397 A1 | 12/2009 | Nguyen et al. |
| 2010/0191900 A1 | 7/2010 | Park |
| 2010/0191997 A1 | 7/2010 | Dodeja et al. |
| 2010/0271092 A1 | 10/2010 | Zerbe et al. |
| 2011/0001358 A1 | 1/2011 | Conroy et al. |
| 2013/0073886 A1 | 3/2013 | Zaarur |
| 2013/0170067 A1 | 7/2013 | Carter et al. |
| 2013/0326185 A1 | 12/2013 | Loh et al. |
| 2014/0067139 A1 | 3/2014 | Berke et al. |
| 2014/0112079 A1 | 4/2014 | Post et al. |
| 2014/0136858 A1 | 5/2014 | Jacobson et al. |
| 2014/0195996 A1* | 7/2014 | Bose ............... G06F 30/392 716/120 |
| 2016/0077961 A1 | 3/2016 | Erez et al. |
| 2016/0320980 A1 | 11/2016 | Fang et al. |
| 2018/0143772 A1 | 5/2018 | Reusswig et al. |
| 2018/0188798 A1 | 7/2018 | Schmidt et al. |
| 2018/0232036 A1* | 8/2018 | Varadarajan ......... G06F 1/3209 |
| 2018/0285732 A1 | 10/2018 | Kurian et al. |
| 2019/0073139 A1 | 3/2019 | Kim et al. |
| 2019/0130984 A1 | 5/2019 | Jean |
| 2019/0212932 A1 | 7/2019 | Yoo et al. |
| 2019/0235774 A1 | 8/2019 | Benisty et al. |
| 2020/0104062 A1 | 4/2020 | Cho |
| 2020/0356153 A1 | 11/2020 | Kim |
| 2021/0011538 A1* | 1/2021 | Parry ............... G06F 1/3225 |
| 2021/0081016 A1* | 3/2021 | Hovis .............. G06F 1/324 |
| 2021/0126641 A1* | 4/2021 | Yan ................ G06F 13/4022 |
| 2021/0294640 A1* | 9/2021 | Muller ............. G06F 9/4812 |
| 2021/0313991 A1* | 10/2021 | Srinivasan ....... H03K 19/17784 |

OTHER PUBLICATIONS

International Search Report and Written Opinion, PCT App. No. PCT/US2020/040541, dated Oct. 26, 2020, 10 pages.

International Search Report and Written Opinion, PCT App. No. PCT/US2020/041016, dated Oct. 26, 2020, 10 pages.

Notice of Allowance, U.S. Appl. No. 16/820,478, dated Jul. 26, 2021, 5 pages.

Non-Final Office Action, U.S. Appl. No. 16/820,478, dated Apr. 14, 2021, 24 pages.

Notice of Allowance, U.S. Appl. No. 16/510,696, dated Mar. 18, 2021, 5 pages.

Notice of Allowance, U.S. Appl. No. 16/510,696, dated Mar. 30, 2021, 6 pages.

International Search Report and Written Opinion, PCT App. No. PCT/US2021/018843, dated Jun. 11, 2021, 10 pages.

Notice of Allowance, U.S. Appl. No. 16/510,696, dated Apr. 29, 2021, 5 pages.

First Office Action, CN App. No. 202080056185.1, dated Jul. 8, 2022, 22 pages (11 pages of English Translation and 11 pages of Original Document).

* cited by examiner

PEAK POWER MANAGEMENT OF DICE IN A POWER NETWORK

TECHNICAL FIELD

The present disclosure generally relates to die power management, and more specifically, relates to dynamically managing peak power of dice in a power network.

BACKGROUND ART

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components distributed across a plurality of dice driven by one or more power networks. Using a single power network as an example, each memory component can be connected to the same distributed power supply. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
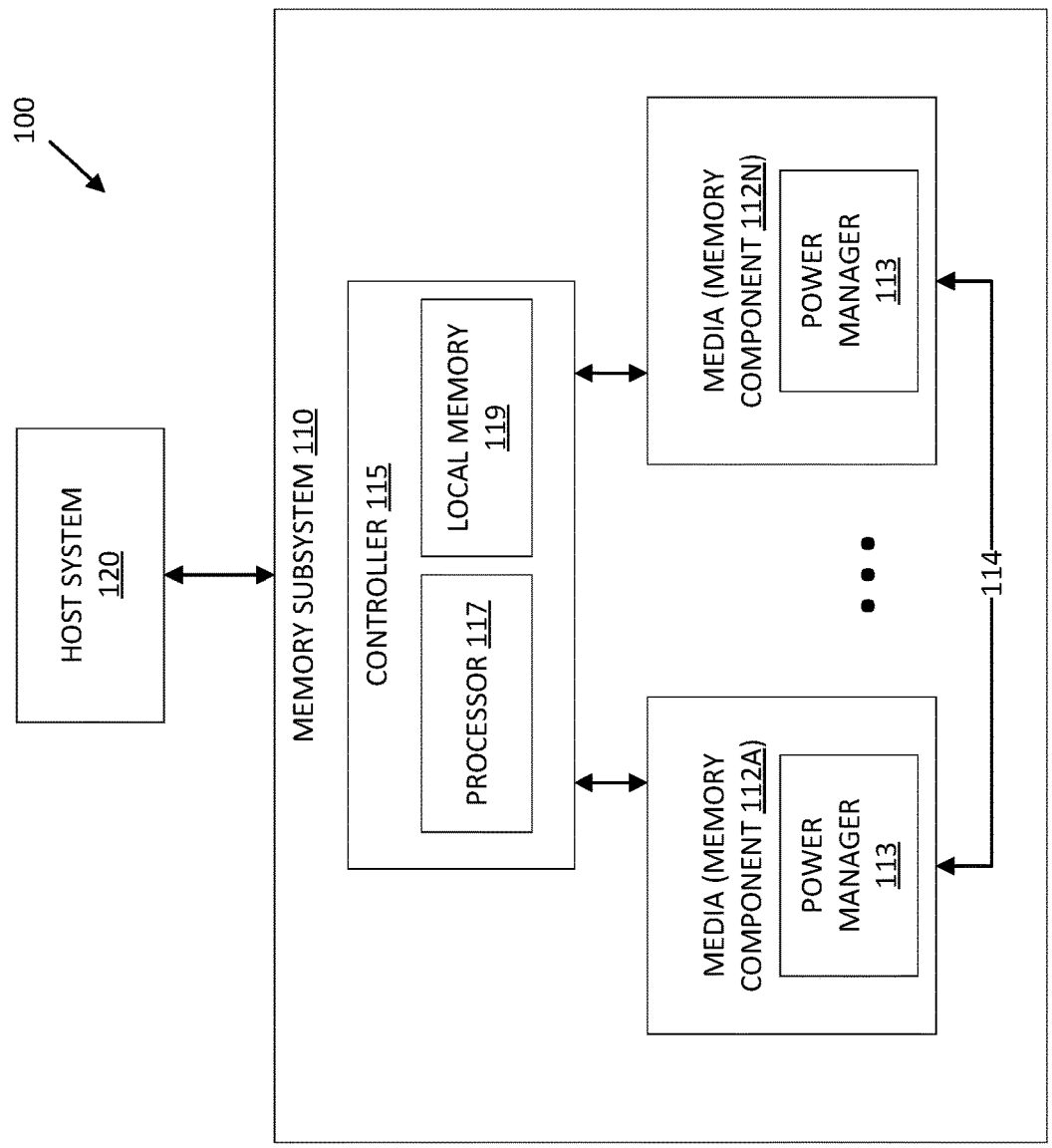
FIG. 1 illustrates an example computing environment that includes a memory subsystem in accordance with some embodiments of the present disclosure.

Aspects of the present disclosure are directed to manage peak power in a power network, such as memory components of a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

In one embodiment, memory components are implemented by different dice that are a part of a single power network. The cumulative power consumption in the power network can be subject to a current or power limit, especially in mobile systems. Operations such as programming, erasing, and reading a memory component, however, are relatively high current operations that create greater demands on the shared power network (peak power operations). Too many memory components executing high current operations concurrently can result in a voltage drop that reduces noise margins, injects noise, or introduces other error-prone conditions for the memory components. As such, systems can maintain a power consumption limit in the power network by limiting the number of dice that perform peak power operations concurrently. A conservative approach to managing peak power assumes all dice not performing a peak power operation are active and consuming a "worst case" amount of power when active that is less than a peak power operation but contributes to the cumulative power consumption in the power network. Assuming all dice are active, however, forgoes the opportunity to allow more dice to perform peak power operations when one or more dice are inactive or otherwise consuming less power.

Aspects of the present disclosure address the above and other deficiencies by the dice communicating to indicate when they are in or entering one of a plurality of states. For example, states can include a high current state for peak power operations and an active current state for low or moderate power operations. A lack of communication of state can be an indication that a die is in an inactive state. Using the communicated states of other dice in the power network (or lack of communication of state), a die can determine how many dice are active (all dice in a high current state or active current state), select a corresponding threshold number of dice that can concurrently be in a high current state based upon the number of active dice, and enter a high current state if the die will not exceed the threshold in doing so. As a result, the power network can take advantage of dice being less active or inactive to dynamically determine power consumption among the dice and select an appropriate threshold number of dice to concurrently execute peak power operations. Maximizing the number of dice able to concurrently execute peak power operations due to other dice, e.g., being inactive, improves system performance. While the examples set forth herein focus on memory systems, embodiments apply to managing peak power in other power networks as well.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N. In one embodiment, each memory component 112 includes a processor (or similar circuitry) and local memory.

The memory subsystem 110 includes a power manager 113 in each memory component 112 that can manage peak power consumption within the power network. For example, memory components 112A to 112N can be a part of a single power network. The power manager 113 can receive and transmit power consumption signals from/to other memory components 112 via the memory component bus 114 and determine a threshold number of memory components 112 permitted to be in a peak power state based upon the dynamic states of other memory components 112. In one embodiment, the memory component bus 114 is an open drain bus that a memory component 112 pulls low to communicate state information with other memory components 112 in the power network. Further details with regards to the operations of the power manager 113 are described below.

Figure 2:
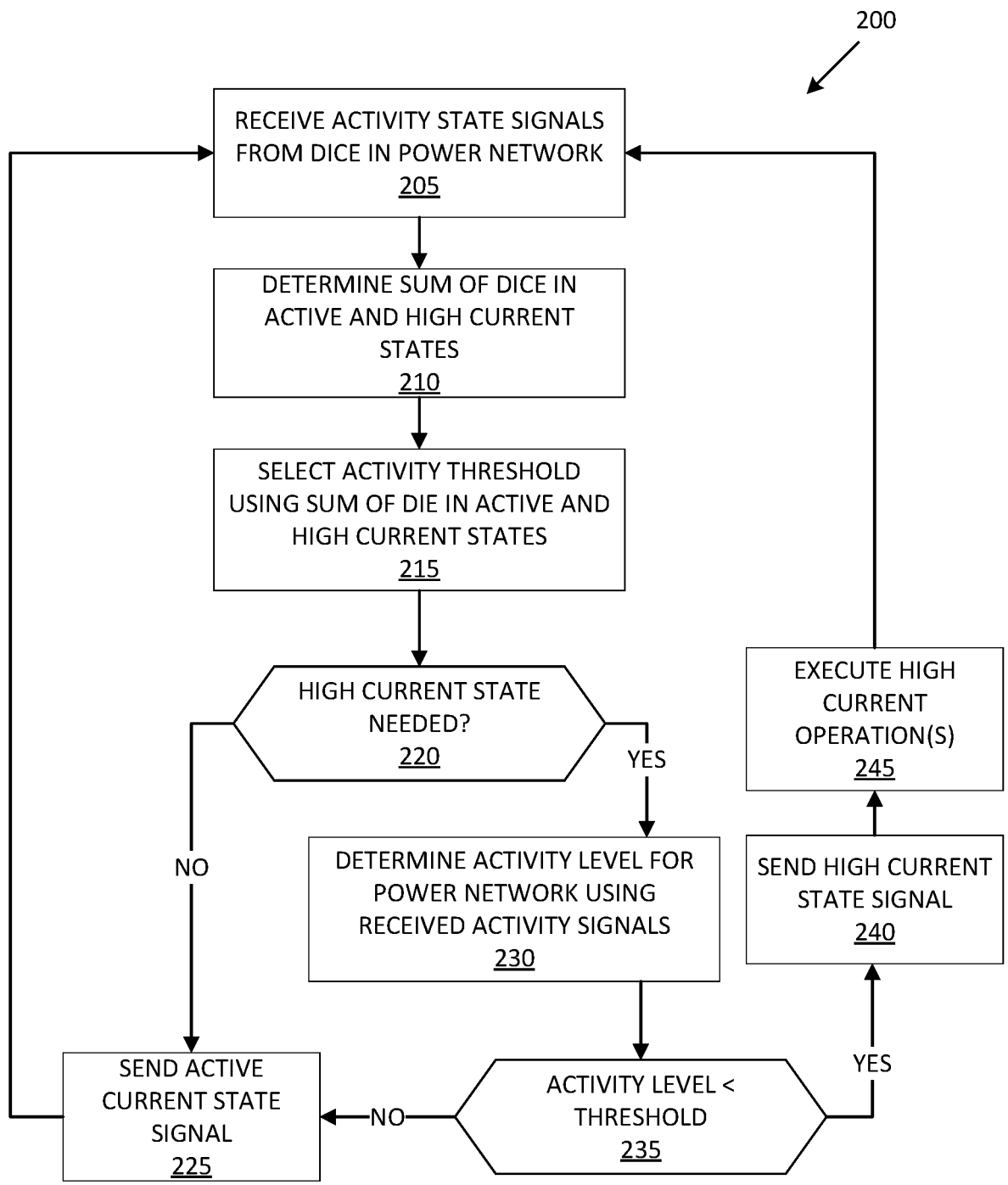
FIG. 2 is a flow diagram of an example method to manage peak power of dice in a power network in accordance with some embodiments of the present disclosure.

FIG. 2 is a flow diagram of an example method 200 to manage peak power of dice/memory components 112 in a power network, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the power manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives activity state signals from memory components 112 in the power network. For example, a first power manager 113 of a first memory component 112 can receive activity state signals from one or more power managers 113 of other memory components 112. In one embodiment, one memory component 112 serves as a bus master and assigns a time slot to each power manager 113 to transmit an activity state signal (e.g., via round robin scheduling or another bus sharing algorithm). Each memory component 112, during its assigned time slot, pulls the bus 114 low and transmits its activity state signal to the other memory components 112. In one embodiment, the bus 114 is a multi-master bus and the memory components 112 utilize a bus arbitration scheme to select a new master when a current master enters an inactive state. In another embodiment, each memory component 112 contends for the bus (e.g., without assigned time slots) until all active memory components 112 have transmitted an activity state signal.

In one embodiment, the activity state signals include a first signal indicating the corresponding memory component 112 is in or entering a high current state and a second signal indicating that the corresponding memory component 112 is in or entering an active current state. While an "active" memory component may be in either a high current state or an active current state, the active current state signal represents a low or moderate current state for the corresponding memory component 112. In one embodiment, each activity state signal indicates an intended current state for the corresponding memory component 112, but each power manager 113 determines if that memory component 112 can actually enter the intended current state after receiving activity state signals from all of the other active memory components 112.

In one embodiment, a memory component 112 sends no activity state signal when in or entering an inactive state. For example, during the bus time slot assigned to that memory component 112, or otherwise during a period in which all activity state signals are expected to be received if all memory components 112 are active, the other memory components 112 receive no activity state signal from the inactive memory component 112.

In one embodiment, a memory component 112 returning to an active state from an inactive state triggers the communication of activity states in the power network. For example, the memory component 112 returning from an inactive state can broadcast a request for status from the other memory components 112 or otherwise advertise to the other memory components 112 that it is no longer in an inactive state. Likewise, before entering an inactive state, a memory component 112 can broadcast a status update to other memory components 112 that it will be in an inactive state.

At operation 210, the processing device determines how many memory components 112 are active. For example, the first power manager 113 increments a counter for each activity state signal received to determine a sum of memory components 112 that are in the active current state and in the high current state or simply how many memory components 112 are active as opposed to inactive.

At operation 215, the processing device selects an activity threshold using the determined number of active memory components 112. For example, each memory component 112 can store in local memory a data structure mapping numbers of active memory components 112 to different activity threshold values. The first power manager 113 uses the determined number of active memory components 112 to search the data structure and find the corresponding activity threshold value. In one embodiment, the threshold value represents a number of memory components 112 that can be in a high current state concurrently.

In one embodiment, the power managers 113 participate in two rounds of transmitting and receiving activity state signals. The first round of communicating activity state signals is described with reference to operation 205 and these activity state signals indicate intended current states for the memory components 112. The first round enables the power managers 113 to determine how many memory components 112 are currently active in the power network and select a threshold. Once the power manager 113 selects the threshold, a second round of communicating activity state signals takes place. Again, this second round of activity state signal communications can be in accordance with a bus sharing algorithm as directed by a bus master or by each memory component 112 contending for the bus 114 and taking a turn to transmit an activity state signal when the memory component 112 successfully pulls the bus 114 low.

At operation 220, the processing device determines if it needs to enter a high current state. For example, the first power manager 113 can determine if the first memory component 112 has any program, erase, or read commands queued that require a high current state.

If the high current state is not needed, at operation 225, the processing device transmits an active current state signal. For example, during an assigned time slot for the bus 114, the first power manager 113 transmits an indication that the first memory component 112 is in or entering an active current state to the other memory components 112 in the power network. As described above, this transmission can be a part of the second round of activity state signal communications. In another embodiment, only memory components 112 transmitting a high current state signal transmit during the second round of activity state signals and the first power manager 113 transmitting an active current state signal is a part of the first round of communications. The processing device can remain in this active current state for a predetermined period (e.g., based upon time, number of operations, etc.), after which the method 200 returns to operation 205.

If the high current state is needed, at operation 230, the processing device determines an activity level of the power network using the received activity state signals. In an embodiment in which there are only two current states for active memory components 112 (i.e., an active current state and a high current state), the first power manager 113 determines the number of memory components 112 that transmitted an indication of a high current state. For example, the first power manager 113 increments a counter for each high current state signal received in the second round of activity state signal communications to determine a current sum of memory components 112 that are in or entering the high current state. In an embodiment in which the current states are represented by more than two values, the first power manager 113 determines a sum of current state values received as activity state signals. For example, the first power manager 113 can increment a running total each time it receives an activity state signal by the value of that activity state signal.

At operation 235, the processing device determines if the activity level of the power network is below the activity threshold. For example, the first power manager 113 determines if the power network has not yet reached the threshold number of memory components 112 that are permitted to be concurrently in a high current state. If the power network has reached the activity threshold, the method 200 proceeds to operation 225 as described above and the memory component 112 delays its high current state operations.

If the power network has not reached the activity threshold, at operation 240, the processing device transmits a high current state signal. For example, during an assigned time slot for the bus 114, the first power manager 113 transmits an indication that the first memory component 112 is in or entering a high current state to the other memory components 112 in the power network. As described above, this transmission can be a part of the second round of activity state signal communications.

At operation 245, the processing device executes one or more high current state operations while in the high current state. The processing device can remain in this high current state for a predetermined period (e.g., based upon time, number of operations, etc.), after which the method 200 returns to operation 205.

Figure 3:
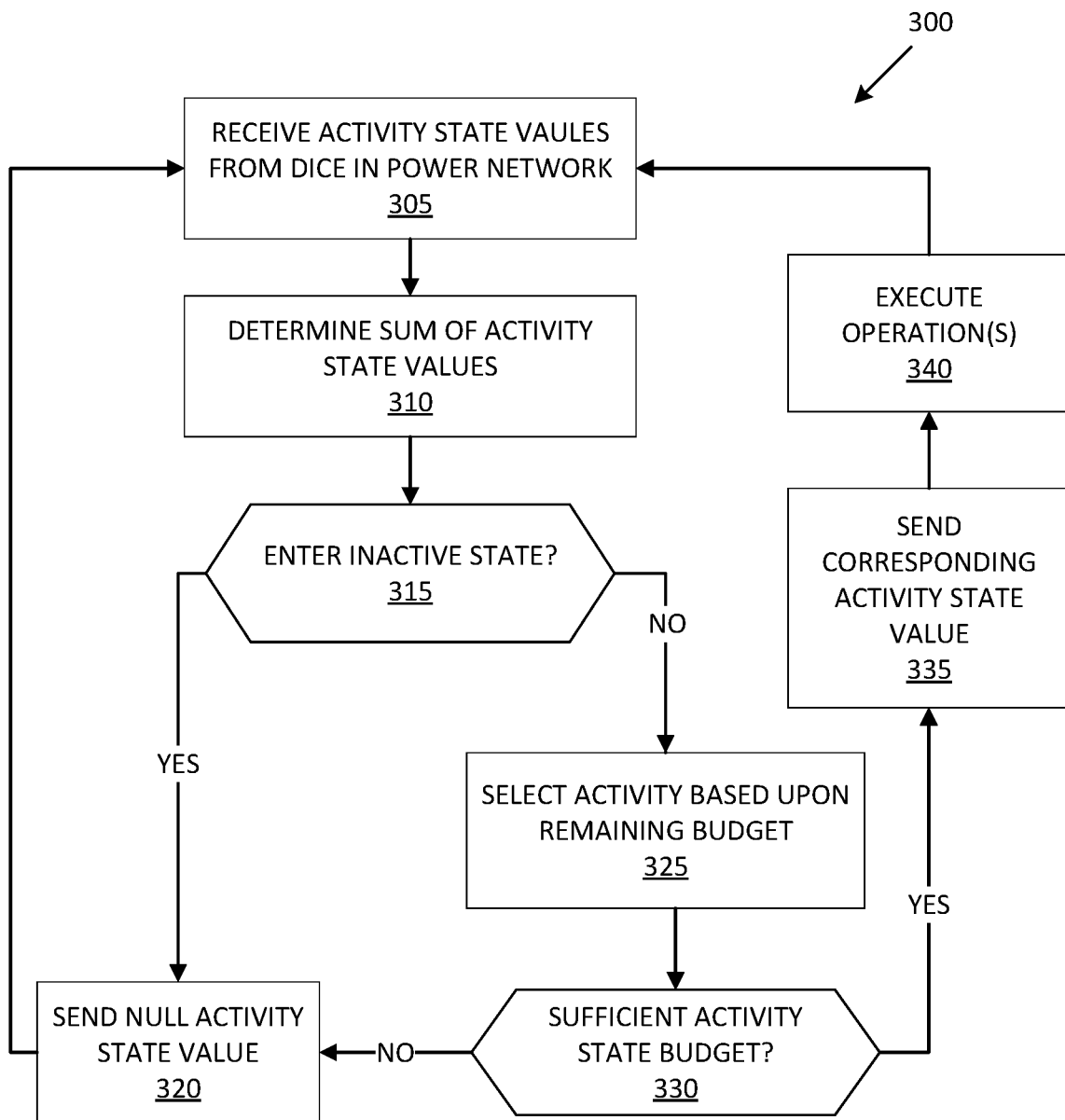
FIG. 3 is a flow diagram of another example method to manage peak power of dice in a power network in accordance with some embodiments of the present disclosure.

FIG. 3 is a flow diagram of another example method 300 to manage peak power of dice/memory components in a power network, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives activity state signals from memory components 112 in the power network. For example, a first power manager 113 of a first memory component 112 can receive activity state signals from one or more power managers 113 of other memory components 112. In one embodiment, one memory component 112 serves as a bus master and assigns a time slot to each power manager 113 to transmit an activity state signal (e.g., via round robin scheduling or another bus sharing algorithm). Each memory component 112, during its assigned time slot, pulls the bus 114 low and transmits its activity state signal to the other memory components 112. In one embodiment, the bus 114 is a multi-master bus and the memory components 112 utilize a bus arbitration scheme to select a new master when a current master enters an inactive state. In another embodiment, each memory component 112 contends for the bus (e.g., without assigned time slots) until all active memory components 112 have transmitted an activity state signal.

In one embodiment, the activity state signals include a plurality of values indicating high, moderate, low, and inactive current states. For example, a value of 3 can indicate a high current state, a value of 2 can indicate a moderate current state, a value of 1 can indicate a low current state, and a value of 0 can indicate an inactive state. In other examples, high, moderate, and/or low power states can each be represented by two or more different values representing varied current levels. For example, different values ranging from 1-3, 1-4, 1-5, etc. may represent different current/power needs corresponding to an idle operation, a read operation, a write operation, no internal activity (e.g., beside transferring data out of the component), an erase operation, etc.

At operation 310, the processing device determines a sum of the activity state signal values. As described below, the power manager 113 uses the summation of the activity state values to determine the ongoing power/current in the network of the other memory components 112 and estimate if there is enough power/current budget available to do pending operations. In one embodiment, the processing device maintains a running total for each round of advertised activity state values. For example, the first power manager 113 initializes a running total (e.g., to zero) each round and increments the running total by each received activity state signal value. In another embodiment, the first power manager 113 increments or decrements a running total by a corresponding increase or decrease represented by the activity state signal value compared to a previous activity state signal for the memory component 112. For example, the first power manager 113 can maintain a table or other data structure to store a current activity state signal value for each memory component 112. When the first power manager 113 receives a new activity state signal value for a memory component 112, it can determine the difference between the new activity state signal value and the previous activity state signal before updating the data structure. The first power manager 113 applies the difference to the running total.

At operation 315, the processing device determines if the first memory component 112 will enter an inactive state. In one embodiment, memory components 112 enter an inactive state following a high current state. For example, first power manager 113 can determine if the first memory component 112 was in a high current state in a previous activity and, if so, determine to enter an inactive state. Additionally, or alternatively, the first power manager 113 can determine that the memory component 112 will enter an inactive state in response to detecting that there are no operations or commands to execute.

At operation 320, if the processing device determines the first memory component 112 will enter an inactive state, the processing device optionally sends a null activity state value. For example, the first power manager 113 can send an activity state value of 0 to represent that the first memory component 112 will be inactive. In an alternate embodiment, the first power manager 113 sends no activity state information and other power managers 113 interpret the lack of an activity state signal as an indication of inactivity. Additionally, the first power manager 113 can cause the first memory component 112 to enter the inactive state until, e.g., the expiration of time or receipt of a command from the controller 115.

At operation 325, if the processing device determines the first memory component 112 has one or more operations to perform that correspond to a low, moderate, or high current state or otherwise is not going to enter an inactive state, the processing device selects an activity based upon the determined sum of activity state values. For example, the first power manager 113 can determine if the first memory component 112 has any queued commands or operations that correspond to a high, moderate, or low current state. The first power manager 113 additionally estimates a remaining "budget" for activity state values by, e.g., subtracting the sum of current activity state values from a maximum value for the sum of activity state values. This maximum value represents a total amount of current or power demand that can be placed on the power network at a given time. If the remaining budget is greater than a activity state value for the next operation for the first memory component 112, the first power manager 113 selects the next operation. If the remaining budget will not support the next operation but it will support another queued operation (e.g., the next operation is a high current operation and a subsequent operation is a low current operation), the first power manager 113 selects the other queued operation.

In one embodiment, the processing device leaves some of the remaining budget for power managers 113 in the power network that have not yet sent activity state values. For example, if the first power manager 113 receives three activity state values from three other power managers 113 and there are two more power managers 113 that have yet to transmit activity state values, the first power manager 113 uses the three received activity state values to determine the remaining budget but leaves some amount of activity state value for the other two memory components 112. In one embodiment, the first power manager 113 leaves some of the remaining budget by multiplying the number of power managers 113 that have yet to send activity state values by a value for a low current state. As a result, each power manager 113 will have at least enough remaining budget to execute a low current state operation. Continuing the example above, the first power manager 113 can subtract the sum of the three received activity state values and double the minimum threshold activity state value (for the two power managers 113 that have yet to send activity state values) from the maximum value to determine how much of the remaining budget the first power manager 113 can utilize.

At operation 330, the processing device determines if there is sufficient remaining budget for the selected activity. For example, while the first power manager 113 uses the remaining budget to select an activity, the first power manager 113 can determine that none of its queued operations will fit within the remaining budget. This can occur, e.g., when the first power manager 113 only has queued moderate and/or high current operations and only the remaining budget for a low current operation.

If there is not sufficient remaining budget for the selected activity, the method 300 proceeds to operation 320 as described above. If there is sufficient remaining budget for the selected activity, at operation 335, the processing device transmits the activity state signal value for the selected activity. For example, during an assigned time slot for the bus 114, the first power manager 113 transmits an indication that the first memory component 112 is in or entering a high, moderate, or low current state to the other memory components 112 in the power network.

At operation 340, the processing device executes one or more operations corresponding to the selected activity. The processing device can remain in this current state for a predetermined period (e.g., based upon time, number of operations, etc.), after which the method 300 returns to operation 305.

Figure 4:
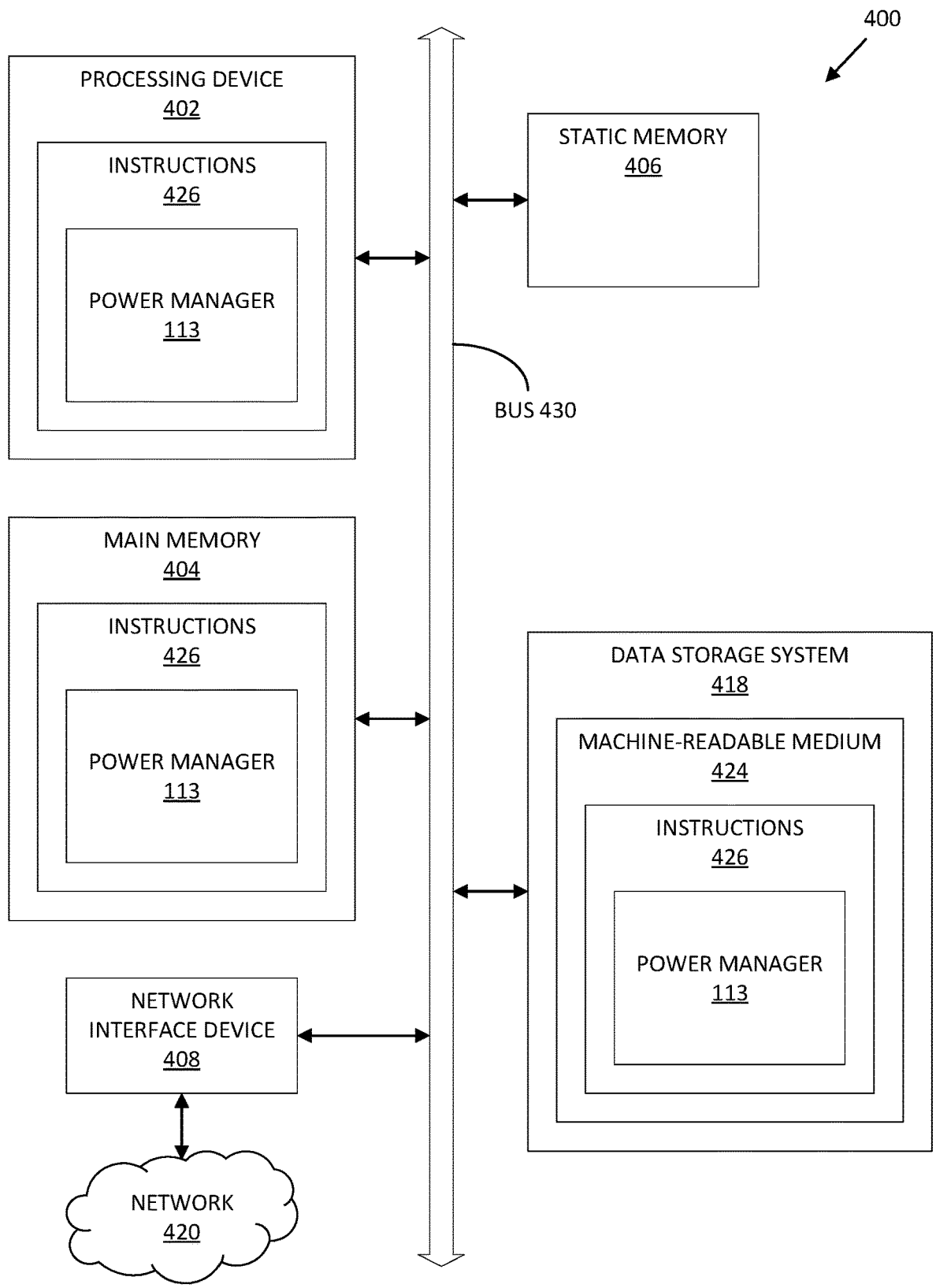
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the power manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a power manager 113 (e.g., the power manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as a memory component 112, may carry out the computer-implemented method 200 in response to its processor executing a computer program (e.g., a sequence of instructions) contained in a memory or other non-transitory machine-readable storage medium. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

receiving, by a first die in a power network from each die of a plurality of dice in the power network, a first signal indicating that the respective die of the plurality of dice is in a high current state or a second signal indicating that the respective die of the plurality of dice is an active current state, wherein the active current state represents a low current state or a moderate current state, and wherein the received signals include at least one second signal;

determining, using the received signals, a first number representing a sum of a number of dice of the plurality of dice in the high current state and a number of dice of the plurality of dice in the active current state;

selecting a first activity threshold using the first number;

determining, using the received signals, a second number representing an activity level for the power network; and transmitting, to the plurality of dice, the first signal indicating that the first die is in the high current state in response to determining that the second number is less than the first activity threshold.

2. The method of claim 1, wherein a second die in the power network is in an inactive state, and wherein the first die does not receive a first signal or a second signal from the second die while the second die is in the inactive state.

3. The method of claim 2, further comprising:

receiving a request for status from the second die indicating that the second die is returning from the inactive state; and in response to the request, transmitting the first signal or the second signal to the plurality of dice.

4. The method of claim 2, further comprising:
receiving the second signal from the second die, the second signal indicating that the second die is no longer in the inactive state;
in response to receiving the second signal from the second die, incrementing the first number to a third number; and
selecting a second activity threshold using the third number, wherein the second activity threshold is different than the first activity threshold.

5. The method of claim 1, wherein the second number is a sum of first signals received from the plurality of dice and the first activity threshold is a number of dice permitted to concurrently be in a high current state based upon the determined first number.

6. The method of claim 1, wherein the plurality of dice communicate via a multi-master bus and wherein the plurality of dice utilize a bus arbitration scheme to select a new master when a current master enters an inactive state.

7. The method of claim 1, further comprising:
receiving, by the first die in a power network from each die of a plurality of dice in the power network, the first signal or the second signal;
determining, using the received signals, a third number representing a sum of a number of dice of the plurality of dice in the high current state and a number of dice of the plurality of dice in the active current state;
selecting a second activity threshold using the third number;
determining, using the received signals, a fourth number representing an activity level for the power network; and
transmitting, to the plurality of dice, the second signal indicating that the first die is in the low current state or the moderate current state in response to determining that the second number is greater than the first activity threshold.

8. A non-transitory computer-readable storage medium comprising instructions that, when executed by a processing device, cause the processing device to:
receive, from each die of a plurality of dice in a power network, a first signal indicating that the respective die of the plurality of dice is in a high current state or a second signal indicating that the respective die of the plurality of dice is an active current state, wherein the active current state represents a low current state or a moderate current state, and wherein the received signals include at least one second signal;
determine, using the received signals, a first number representing a sum of a number of dice of the plurality of dice in the high current state and a number of dice the plurality of dice in the active current state;
select a first activity threshold using the first number;
determine, using the received signals, a second number representing an activity level for the power network; and
transmit, to the plurality of dice, the first signal indicating that a first die in the power network is in the high current state in response to determining that the second number is less than the first activity threshold.

9. The non-transitory computer-readable storage medium of claim 8, wherein a second die in the power network is in an inactive state, and wherein the first die does not receive a first signal or a second signal from the second die while the second die is in the inactive state.

10. The non-transitory computer-readable storage medium of claim 9, wherein the processing device is further to:
receive a request for status from the second die indicating that the second die is returning from the inactive state; and
in response to the request, transmit the first signal or the second signal to the plurality of dice.

11. The non-transitory computer-readable storage medium of claim 9, wherein the processing device is further to:
receive the second signal from the second die, the second signal indicating that the second die is no longer in the inactive state;
in response to receiving the second signal from the second die, increment the first number to a third number; and
select a second activity threshold using the third number, wherein the second activity threshold is different than the first activity threshold.

12. The non-transitory computer-readable storage medium of claim 8, wherein the second number is a sum of first signals received from the plurality of dice and the first activity threshold is a number of dice permitted to concurrently be in a high current state based upon the determined first number.

13. The non-transitory computer-readable storage medium of claim 8, wherein the plurality of dice communicate via a multi-master bus and wherein the plurality of dice utilize a bus arbitration scheme to select a new master when a current master enters an inactive state.

14. The non-transitory computer-readable storage medium of claim 8, wherein the processing device is further to:
receive, by the first die in a power network from each die of a plurality of dice in the power network, the first signal or the second signal;
determine, using the received signals, a third number representing a sum of a number of dice of the plurality of dice in the high current state and a number of dice of the plurality of dice in the active current state;
select a second activity threshold using the third number;
determine, using the received signals, a fourth number representing an activity level for the power network; and
transmit, to the plurality of dice, the second signal indicating that the first die is in the low current state or the moderate current state in response to determining that the second number is greater than the first activity threshold.

15. A system comprising:
a first memory component in a power network; and
a plurality of second memory components in the power network coupled to the first memory component via a memory component bus, wherein the first memory component includes a power manager to:
receive, from each second memory component of a plurality of second memory components, a first signal indicating that the respective second memory component of the plurality of second memory component is in a high current state or a second signal indicating that the respective memory component is an active current state, wherein the active current state represents a low current state or a moderate current state, and wherein the received signals include at least one second signal;
determine, using the received signals, a first number representing a sum of a number of second memory components of the plurality of second memory components in the high current state and a number of second memory components of the plurality of second memory components in the active current state;
select a first activity threshold using the first number;
determine, using the received signals, a second number representing an activity level for the power network; and
transmit, to the plurality of second memory components, the first signal indicating that the first memory component is in the high current state in response to determining that the second number is less than the first activity threshold.

16. The system of claim 15, wherein a second memory component in the power network is in an inactive state, and wherein the first memory component does not receive a first signal or a second signal from the second memory component while the second memory component is in the inactive state and wherein the power manager is further to:
receive a request for status from the second memory component indicating that the second memory component is returning from the inactive state; and
in response to the request, transmit the first signal or the second signal to the plurality of second memory components.

17. The system of claim 15, wherein a second memory component in the power network is in an inactive state, and wherein the first memory component does not receive a first signal or a second signal from the second memory component while the second memory component is in the inactive state and wherein the power manager is further to:
receive the second signal from the second memory component, the second signal indicating that the second memory component is no longer in the inactive state;
in response to receiving the second signal from the second memory component, increment the first number to a third number; and
select a second activity threshold using the third number, wherein the second activity threshold is different than the first activity threshold.

18. The system of claim 15, wherein the second number is a sum of first signals received from the plurality of second memory components and the first activity threshold is a number of memory components permitted to concurrently be in a high current state based upon the determined first number.

19. The system of claim 15, wherein the plurality of second memory components communicate via a multi-master bus and wherein the plurality of second memory components utilize a bus arbitration scheme to select a new master when a current master enters an inactive state.

20. The system of claim 15, wherein the power manager is further to:
receive, from each second memory component of a plurality of memory components in the power network, the first signal or the second signal;
determine, using the received signals, a third number representing a sum of a number of memory components of the plurality of memory components in the high current state and a number of memory components of the plurality of memory components in the active current state;
select a second activity threshold using the third number;
determine, using the received signals, a fourth number representing an activity level for the power network; and
transmit, to the plurality of memory components, the second signal indicating that the first memory component is in the low current state or the moderate current state in response to determining that the second number is greater than the first activity threshold.

* * * * *